(12) United States Patent  
Kurd et al.

(10) Patent No.: US 6,489,821 B1  
(45) Date of Patent: Dec. 3, 2002

(54) HIGH FREQUENCY SYSTEM WITH DUTY CYCLE BUFFER

(75) Inventors: Nasser A. Kurd, Hillsboro, OR (US); Jed Griffin, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/939,763

(22) Filed: Aug. 28, 2001

(51) Int. Cl.[7] .................................................. H03B 1/00
(52) U.S. Cl. ........................ 327/157; 327/156; 331/57; 331/34
(58) Field of Search .................. 327/291, 141–175; 331/57, 34, 74, 8

(56) References Cited

U.S. PATENT DOCUMENTS 5,815,042 A * 9/1998 Chow et al. ................... 331/57
5,942,947 A * 8/1999 Bhagwan ........................ 331/8

* cited by examiner

Primary Examiner—Dinh T. Le  
(74) Attorney, Agent, or Firm—Kenyon & Kenyon

(57) ABSTRACT

A synchronizing apparatus is provided in a high frequency system. The synchronizing apparatus includes a loop control circuit, a voltage controlled oscillator coupled to the loop control circuit, a matched current amplifier coupled to the voltage controlled oscillator, and a duty cycle control buffer connect to the matched circuit amplifier.

16 Claims, 6 Drawing Sheets

HIGH FREQUENCY SYSTEM WITH DUTY CYCLE BUFFER

FIELD OF THE INVENTION

The present invention relates to the field of signal synchronizing and frequency synthesis circuits for sequence control of integrated circuit logic. More specifically, the present invention relates to a signal synchronizing and frequency synthesis circuit of the phase locked loop type.

BACKGROUND

Synchronization of a microprocessor system is accomplished through the use of one or more clock signals. Each component within the system uses a clock signal to synchronize the particular component's internal sequential logic circuitry to that of the entire system in order to operate in accordance with the desired operating protocol standard. In high-speed systems, synchronization of clock signals with each of the clocked components must be maintained with high efficiency to eliminate or reduce system timing errors and delays which may result. A system utilized in maintaining the synchronization of microprocessor systems is the phase lock loop (PLL).

Signal synchronizing and frequency synthesis circuitry such as PLLs are used in synchronous microprocessor systems. In integrated circuit (IC) logic, PLLs are used in order to minimize timing delays and errors which may occur due to the delays. A PLL can be used to synchronize a plurality of signals to conform to a desired frequency signal. The synchronization of the plurality of signals allows a plurality of circuits within the same system to operate in accordance with a desired timing protocol.

Problems in synchronization may occur when various clock signals operating within the same system become misaligned in phase, i.e. skewed, while passing through intermediate circuitry having varying propagation delays. In a high-speed multiple chip computer system, it is desirable to maintain the phase difference between clock signals at various locations in the system to a specified minimum value. However, variations in propagation can be caused by variations in circuitry structure or tolerance associated with the system's manufacturing process.

Additionally, synchronizing or timing problems may occur with respect to typical microprocessor systems that have an external clock signal and another clock signal which is internal to the microprocessor core. These two external and internal clock signals may sometimes become out of phase in relation to each other, as between the clock signal internal to the microprocessor core and inputs generated by a clock signal external to the microprocessor core.

BRIEF DESCRIPTION OF THE DRAWINGS

The present invention is illustrated by way of example in the following drawings in which like references indicate similar elements. The following drawings disclose various embodiments of the present invention for purposes of illustration only and are not intended to limit the scope of the invention.

DETAILED DESCRIPTION

Figure 1:
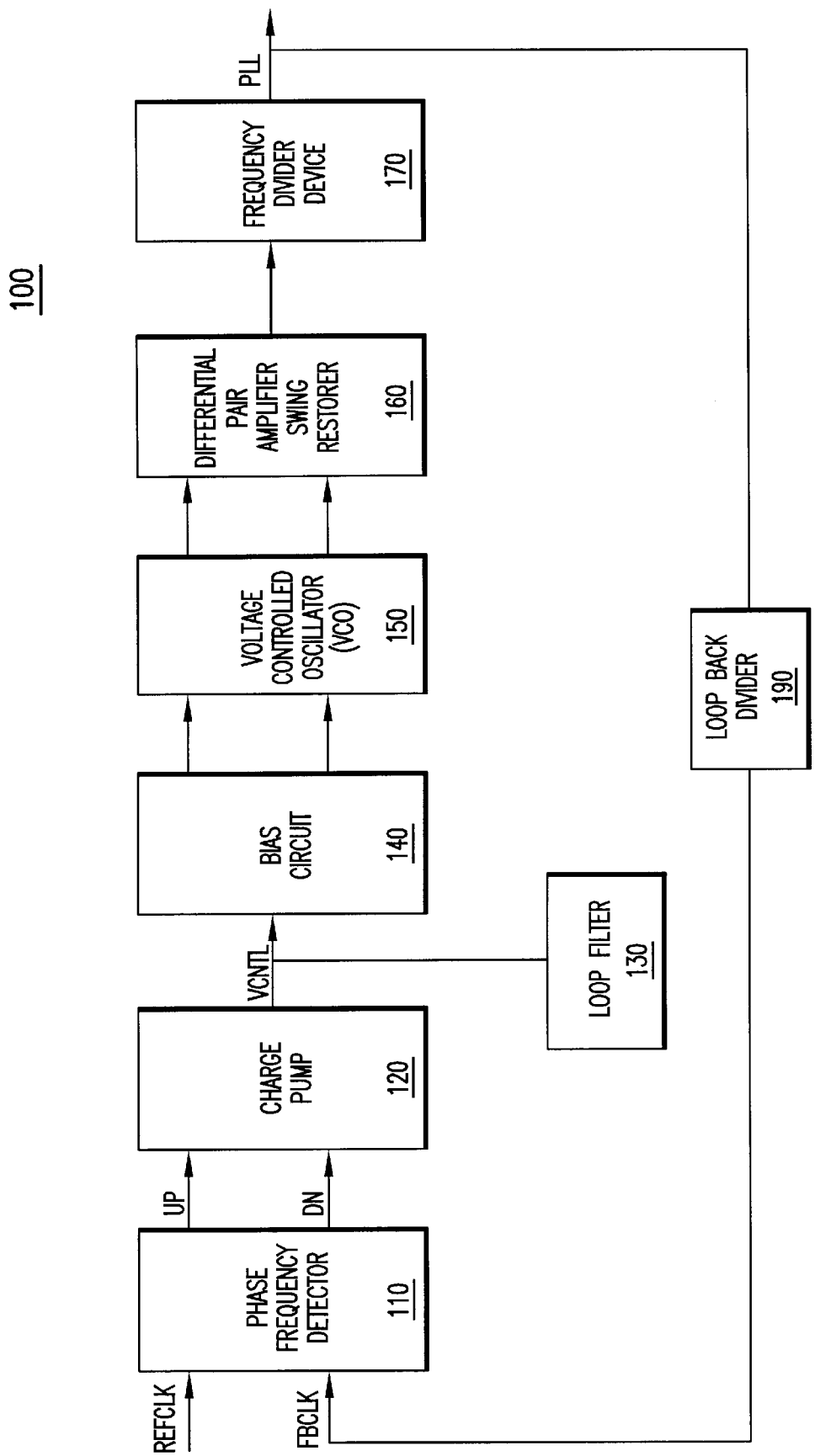
FIG. 1 illustrates an exemplary phase lock loop (PLL).

The PLL is a type of feedback control system that attempts to maintain a constant or zero phase difference an external clock signal and an internal clock signal in order to prevent timing errors which can lead to delays in microprocessor operation. FIG. 1 shows one exemplary embodiment of a PLL. As shown in FIG. 1, PLL 100 includes a phase frequency detector 110, charge pump 120, loop filter 130, a bias circuit 140, a voltage controlled oscillator (VCO) 150, a differential pair amplifier restorer 160, and a frequency divider device 170 which are interconnected to form a feedback PLL system.

In operation, the phase frequency detector 110 receives an input (or external clock) signal (REFCLK) and a feedback signal (FBCLK). As shown in FIG. 1, the FBCLK signal is the output signal (PLLOUT) output from the voltage controlled oscillator (VCO) 150, the signal having passed through the differential pair amplifier restorer 160 and the frequency divider device 170. The phase frequency detector 110 compares the REFCLK signal and the FBCLK signal to determine if there is any phase difference between the REFCLK signal and the FBCLK signal. If the phase frequency detector 110 detects a phase difference, the phase frequency detector 110 generates one of an up (UP) signal or a down (DN) signal in order to pump a control voltage (VCNTL) higher or lower. For example, if the REFCLK signal leads the FBCLK signal, then the phase frequency detector 110 would activate the UP signal a specific amount corresponding to the phase difference. Alternately, if the FBCLK signal leads the REFCLK signal, then the phase frequency detector 110 would activate the DN signal a specific amount corresponding to the phase difference. If the REFCLK signal and the FBCLK signal are in-phase, then both the UP signal and the DN signal are activated for a small time simultaneously such that the control voltage does not change.

Activated by the phase frequency detector 110, the Up signal or the DN signal charges and discharges the capacitor voltage of the loop filter 130. The charged/discharged capacitor voltage of the loop filter 130 is applied to the bias circuit 140, which generates the NBIAS signal and PBIAS signal that control the frequency of the voltage controlled oscillator (VCO) 150. That is, the charge pump 120 converts the digital state (UP/DN) of the phase frequency detector 110 into an analog control voltage (VCNTL) which is used to operate and control the voltage controlled oscillator (VCO) 150. The control voltage signal (VCNTL) is then applied to the voltage controlled oscillator (VCO) 150 which varies the set frequency of the voltage controlled oscillator (VCO) 150 in a direction which reduces the frequency difference or phase error between the input signal (REFCLK) and the feedback signal (FBCLK).

In one exemplary embodiment, the voltage controlled oscillator (VCO) 150 outputs two differential signals, where the swing of these signals depends on the frequency of operation. These signals are then supplied to the differential pair amplifier restorer 160, which converts the differential analog swing to a single-ended digital swing. The duty cycle output of the differential pair amplifier restorer 160 depends on the voltage swing of the voltage controlled oscillator (VCO) 150, which varies with frequency.

The signal output from the differential pair amplifier restorer 160 is output to the frequency divider device 170, before being applied back to the phase frequency detector 110. In the frequency divider device 170, the signal is then divided by two to maintain a fifty-percent duty cycle clock. As shown in FIG. 1, at the end of the clock distribution, the signal is then input to a loop back divider 190 where it is further divided by a ratio (N), and then fed back to the PLL 100. The ratio (N) determines the frequency of the signal generated by the PLL 100. The process is repeated until the REFCLK and FBCLK signals become synchronized and a locked state is achieved.

In the phase lock loop (PLL) of FIG. 1, the total frequency ratio (VCO/PLLOUT) between frequency of the voltage controlled oscillator (VCO) 150 and the frequency of the PLL 100 is 2*N, due to the division by N by the loop back divider 190 and the additional division by 2 by the frequency divider device 170. That is, the frequency of the voltage controlled oscillator (VCO) 150 is divided by 2 by the frequency divider device 170 in addition to being divided by N by the loop back divider 190, before the signal is fed back to the PLL 100.

In the various exemplary embodiments of the present invention, by lowering the total frequency ratio (VCO/PLLOUT) between the frequency of the voltage controlled oscillator (VCO) 150 and the frequency of the PLL 100, a decrease in VCO jitter by the voltage controlled oscillator (VCO) 150 of the PLL 100 can be obtained, for example. That is, a PLL with wide bandwidth may result in low VCO jitter, while a narrow bandwidth may reject the input jitter of the VCO. Further, the bandwidth of the PLL is proportional to the total frequency ratio (VCO/PLLOUT), where the higher the total frequency ratio, the lower the bandwidth of the PLL. Thus, the VCO jitter may be reduced by increasing the bandwidth.

However, high total frequency ratios are desired for synthesizing on-chip frequencies of the PLL from external low frequencies. As a result, the bandwidth of the PLL may be decreased as higher frequencies are desired, increasing the VCO jitter. Accordingly, in accordance with the various exemplary embodiments of the present invention, by removing a divide-by-two restriction, the bandwidth of the PLL may increase, offsetting the increase of total frequency ratio needed to achieve high frequency, for example. Thus, lower VCO jitter may be achieved without reducing the input jitter rejection, since the total frequency ratio is already increased to achieve the desired high frequency. Accordingly, in the PLL of FIG. 1, without the frequency divider device 170, VCO jitter of the voltage controlled oscillator (VCO) 150, for example, can be decreased.

Additionally, in the various exemplary embodiments of the present invention, the VCO gain (kvco) of a voltage controlled oscillator (VCO) without a divide-by-two restriction is lower than that with the divide-by-two restriction, decreasing the sensitivity of the voltage control oscillator (VCO) to noise and power supply, for example. That is, a voltage control oscillator (VCO) with lower VCO gain (kvco) may have lower sensitivity to noise and power supply, while a voltage control oscillator (VCO) with higher VCO gain (kvco) has higher sensitivity to noise and power supply.

In general, frequency (f) of a voltage control oscillator (VCO) is equal to the product of the VCO gain (kvco) of the voltage control oscillator (VCO) and the control voltage (Vc) applied to the voltage control oscillator (VCO), or, f=(kvco)*Vc. Thus, the VCO gain (kvco) is equal to the change in frequency ($\Delta$f) divided by the change in control voltage ($\Delta$Vc), or, kvco=($\Delta$f)/($\Delta$Vc).

To achieve the same core frequency range, if noise or power supply fluctuation changes the control voltage by $\Delta$Vc, then the change in frequency of the voltage control oscillator (VCO) with the divide-by-two restriction ($\Delta$f2) is twice than the change in frequency of the voltage control oscillator (VCO) without the divide-by-two restriction ($\Delta$f1), i.e., $\Delta$f2=2*$\Delta$f1. Thus, the VCO gain (kvco2) of the voltane control oscillator (VCO) with the divide-by-two restriction is twice the VCO gain (kvco1) of the voltage control oscillator (VCO) without the divide-by-two restriction, i.e., kvco2=2*kvco1.

Accordingly, a voltage control oscillator (VCO) with a lower VCO gain (kvco1) may have low sensitivity to noise and power supply, while a voltage control oscillator (VCO) with higher VCO gain (kvco2) may have higher sensitivity to noise and power supply. Thus, in the PLL of FIG. 1, without the frequency divider device 170, noise and power supply sensitivity of the PLL 100, for example, can be decreased from that with the frequency divider device 170. As a result, because a major component of jitter is due to power supply noise, less jitter, for example, may be obtained when operating without the frequency divider device 170.

Further, without a divide-by-two restriction, lower IR drop may be enabled to achieve better signal-to-noise ratio (S/N), for example, and lower current rating of the external or internal analog filter components of the PLL may be obtained to lower cost and increase compatibility of the PLL, for example. That is, in general, a PLL with lower IR drop may achieve better signal-to-noise ration (S/N), and a PLL with lower current rating of external or internal analog filter components may achieve lower cost and higher compatibility of the PLL, for example.

As discussed above, in a PLL, to achieve the same core frequency, the VCO frequency with the divide-by-two restriction is twice the frequency without the divide-by-two restriction. Accordingly, the current I without the divide-by-two restriction is half that of the current I with the divide-by-two restriction. Thus, IR without the divide-by-two restriction is half that of the IR with the divide-by-two restriction, where the resistance R of the PLL is the same and is constrained by the on-chip and off-chip power supply delivery solution.

In accordance with the various exemplary embodiments of the present invention, by omitting the divide-by-two restriction, lower IR drop and lower current rating of analog filter components may be obtained. Thus, in the PLL of FIG. 1, by omitting the frequency divider device 170, lower IR drop may be enabled as well as lower current rating of the external or internal analog filter components of the PLL 100, for example.

Furthermore, by omitting the divide-by-two restriction, the total frequency ratio between frequency of a voltage controlled oscillator (VCO) and the frequency of a PLL may be decreased, and the loop filter capacitor of the PLL may be decreased in size, for example, decreasing the size of the entire PLL. That is, high total frequency ratio between frequency of a voltage controlled oscillator (VCO) and the frequency of a PLL may require the loop filter capacitor of the loop filter to increase to achieve reasonable damping and bandwidth performance. Since the area of a PLL is dominated by the loop filter capacitor, in the PLL of FIG. 1, it is desirable to decrease the total frequency ratio (VCO/PLLOUT) between frequency of the voltage controlled oscillator (VCO) 150 and the frequency of the PLL 100, and thus, decrease the size of the loop filter capacitor of the PLL 100.

The following detailed description sets forth numerous specific details of various exemplary embodiments of the present invention to provide a thorough understanding of the invention. However, those of ordinary skill in the art will appreciate that the invention may be practiced without these specific details. In various exemplary embodiments, well-known methods, procedures, protocols, components, algorithms, and circuits have not been described in detail so as not to obscure the invention.

Various exemplary embodiments of the present invention provide a synchronizing apparatus 200 capable of operating as a phase lock loop (PLL). In these exemplary embodiments, such as the embodiment shown in FIG. 2, the synchronizing apparatus is used to synthesize frequency, as well as to synchronize out of phase signals in microprocessor operations. The present invention, however, is not limited to microprocessor systems, and could equally be applied to any system in order to address any synchronization or frequency synthesis problems associated with any type of circuit.

Figure 2:
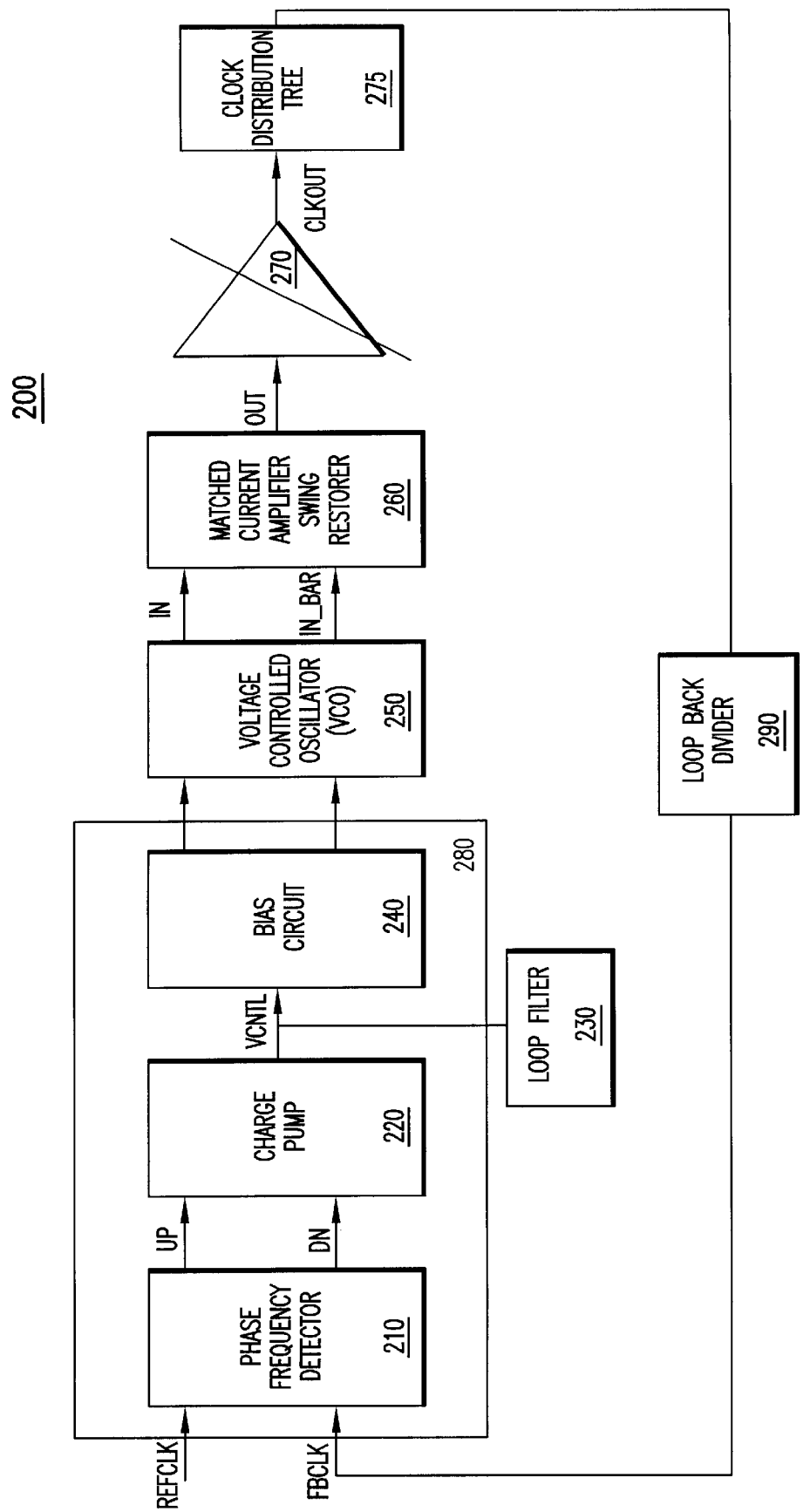
FIG. 2 illustrates an exemplary embodiment of a synchronizing device of the present invention in a block diagram format.

FIG. 2 illustrates one exemplary embodiment of the synchronizing apparatus according to the present invention. As shown in FIG. 2, the synchronizing apparatus 200 may include a phase frequency detector 210, a charge pump 220, a loop filter 230, a bias circuit 240, a voltage controlled oscillator (VCO) 250, a wide matched current amplifier swing restorer 260, and a duty cycle control buffer 270 which are operatively coupled together to form the synchronizing apparatus 200. The phase frequency detector 210 is shown having two inputs that receive a system reference signal or external clock signal (REFCLK) and a feedback or target signal (FBCLK). The REFCLK signal is a reference clock from outside of the chip. The FBCLK signal is the feedback signal from the output (CLKOUT) of the synchronizing apparatus 200, the signal being carried to the phase frequency detector 210 by a feedback loop after the passing through the wide matched current amplifier swing restorer 260 and the duty cycle control buffer 270. As shown in FIG. 2, a loop back divider 290 is inserted after the clock distribution of the output (CLKOUT) of the synchronizing apparatus 200 by a clock distribution tree 275, which generates the feedback clock, to divide the signal by a ratio N.

In operation, the phase frequency detector 210 receives both of the REFCLK signal and the FBCLK signal, and determines if a phase difference exists between the REFCLK signal and the FBCLK signal. If a phase difference is detected, the phase frequency detector 210 generates either an UP digital state signal (UP) or DOWN digital state signal (DN), the digital state signal being proportionate to the magnitude of the detected phase error between the signals.

If there is no phase error, that is, the REFCLK signal and the FBCLK signal are in phase or locked, both the UP signal and the DN signal are high for a small time, which does not affect the value of the control voltage signal (VCNTL) because the UP signal and the DN signal effectively cancel each other. If, on the other hand, a phase error is detected between the signals, the phase frequency detector 210 generates either the UP signal or the DN signal, depending upon the phase relation associated with the detected phase error. For example, if the REFCLK signal leads the FBCLK signal, then the phase frequency detector 210 generates an UP signal which is supplied to the charge pump 220. If the FBCLK signal leads the REFCLK signal, then the phase frequency detector 210 generates a DN signal which is supplied to the charge pump 220.

The charge pump 220, which is coupled between the phase frequency detector 210 and the loop filter 230, receives and converts the UP signal or the DN signal from the phase frequency detector 210 into an analog value, which either charges or discharges the loop filter 230. For example, if the charge pump 220 receives an UP signal from the phase frequency detector 210, the charge pump 220 charges the loop filter 230, based on the width of the UP signal, which proportionately increases the value of the VCNTL signal. On the other hand, if the charge pump 220 receives a DN signal from the phase frequency detector 210, the charge pump 220 discharges the loop filter 230, based on the width of the DN signal, which proportionately decreases the value of the VCNTL signal. When there is no measurable phase error, the charge pump 220 can be configured to maintain the current level of the VCNTL signal at a relatively steady value. Accordingly, the phase difference detected in the phase frequency detector 210 corresponds proportionately to the value of the VCNTL signal as the respective UP signal and DN signal are processed via the charge pump 220. Additionally, the loop filter 230 provides stability in loop operation and minimizes jitter in the system, and can be used in controlling the lock time and overshooting/undershooting of the desired target frequency.

The bias circuit 240 is coupled to the loop filter 230 and receives the VCNTL signal. As an example, the bias circuit 240 may comprise a replica feedback device comprised of half VCO buffer replicas, and an amplifier. The bias circuit 240 converts the VCNTL signal into an n-bias signal and p-bias signal, corresponding to the value of VCNTL.

The phase frequency detector 210, charge pump 220, loop filter 230, and bias circuit 240 collectively constitute a loop control or phase circuit 280 which is common to the operation of the synchronizing apparatus 200. The output from the loop control circuit 280 are two signals representing the phase difference between the FBCLK signal and the REFCLK signal.

As shown in FIG. 2, the loop control circuit 280 is coupled to the voltage controlled oscillator (VCO) 250. The p-bias signal and the n-bias signals are input into the voltage controlled oscillator (VCO) 250 which is coupled to the bias circuit 240. The p-bias signal and the n-bias signal correspond proportionately to the phase difference detected in the phase frequency detector 210 which is reflected in the VCNTL signal.

In one exemplary embodiment of the present invention, the operating signals within the voltage controlled oscillator (VCO) 250 do not operate at full swing, but operate at a swing between a Vcc or supply voltage value (not shown in FIG. 2) and the VCNTL signal, where the VCNTL signal can vary based upon the frequency being processed within the synchronizing apparatus 200.

The voltage controlled oscillator (VCO) 250 is coupled to the phase frequency detector 210 by a feedback loop. The voltage controlled oscillator (VCO) 250 generates two differential signals (In and In_bar), where the swing of these signals depends on the frequency of operation of this embodiment. The two differential signals (In and In_bar) from the voltage controlled oscillator (VCO) 250 are output to the wide matched current amplifier swing restorer 260, which outputs a single-ended clock output (Out), to restore a wider voltage swing as a single signal while maintaining the same phase regardless of the frequency. Because the matched current amplifier swing restorer 260 has a very wide common mode range, the duty cycle output of the matched current amplifier swing restorer 260 does not depend on the voltage swing of the voltage controlled oscillator (VCO) 250, which varies with frequency.

The single-ended clock output (Out) is fed to the duty cycle control buffer 270, then, after clock distribution by the clock distribution tree 275, is divided by N by the loop back divider 290, and becomes a feedback or target signal (FBCLK) which is applied to the phase frequency detector 210 via the feedback loop, repeating the synchronization process until the FBCLK signal becomes synchronized with the REFCLK signal indicating a locked condition or status.

That is, in the PLL operating mode, the loop control circuit 280 generates the bias signals (n-bias and p-bias) which correspond to the phase difference between the REFCLK and FBCLK signals. The voltage controlled oscillator (VCO) 250 receives the bias signals from the loop control circuit 280, and outputs two differential signals (In and In_bar), where the swing of these signals depends on the frequency of operation. These signals (In and In_bar) are then supplied to the matched current amplifier swing restorer 260 to restore the wider voltage swing as a single signal, single-ended clock output (Out), while maintaining the same phase regardless of the frequency.

The single-ended clock output (Out) from the matched current amplifier swing restorer 260 is fed to the duty cycle control buffer 270 to output a programmable duty cycle that is set to obtain high frequency. That is, the capability to adjust the time between the rising and falling edges of the single-ended clock output (Out) is set to obtain high frequency. Thus, the duty cycle is adjusted to fix phase critical paths that may limit frequency to increase the frequency of the synchronizing apparatus 200.

As shown in FIG. 2, the CLKOUT signal from the synchronizing apparatus 200 is then divided by N by the loop back divider 290 after clock distribution by the clock distribution tree 275, to generate the FBCLK signal for feedback to the synchronizing apparatus 200. The ratio (N) determines the frequency of the signal generated by the synchronizing apparatus 200.

The FBCLK signal is then applied via the feedback loop to the phase frequency detector 210 to repeat the synchronizing process through the synchronizing apparatus 200, until the FBCLK signal becomes coincident or in-phase with the REFCLK signal thereby achieving a locked state. In other words, the process is repeated until the REFCLK and FBCLK signals become synchronized and a locked state is achieved. Therefore, in the PLL mode, the synchronizing apparatus 200 essentially operates by adjusting the frequency of the output signal based on the biasing signal value as determined by the phase relationship of the REFCLK and FBCLK signals.

In FIG. 2, the total frequency ratio (VCO/CLKOUT) between the voltage controlled oscillator (VCO) 250 and the synchronizing circuit 200 is N. That is, the frequency of the voltage controlled oscillator (VCO) 250 is only divided by N before the signal is fed back to the synchronizing circuit 200. As shown in FIG. 2, the signal from the voltage controlled oscillator (VCO) 250 is output to the wide matched current amplifier swing restorer 260 and then to the duty cycle control buffer 270.

Figure 3:
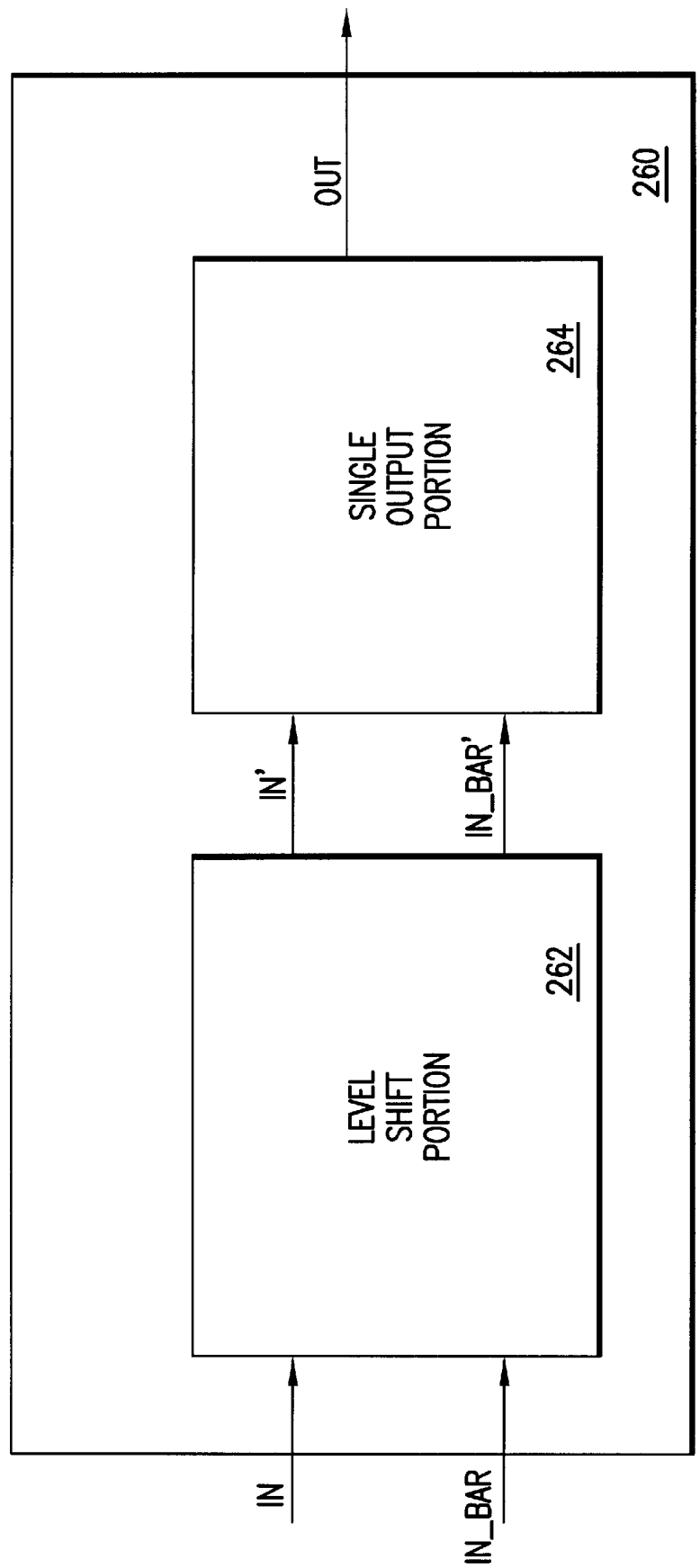
FIG. 3 illustrates an exemplary embodiment of a matched current amplifier of FIG. 2.
Figure 4:
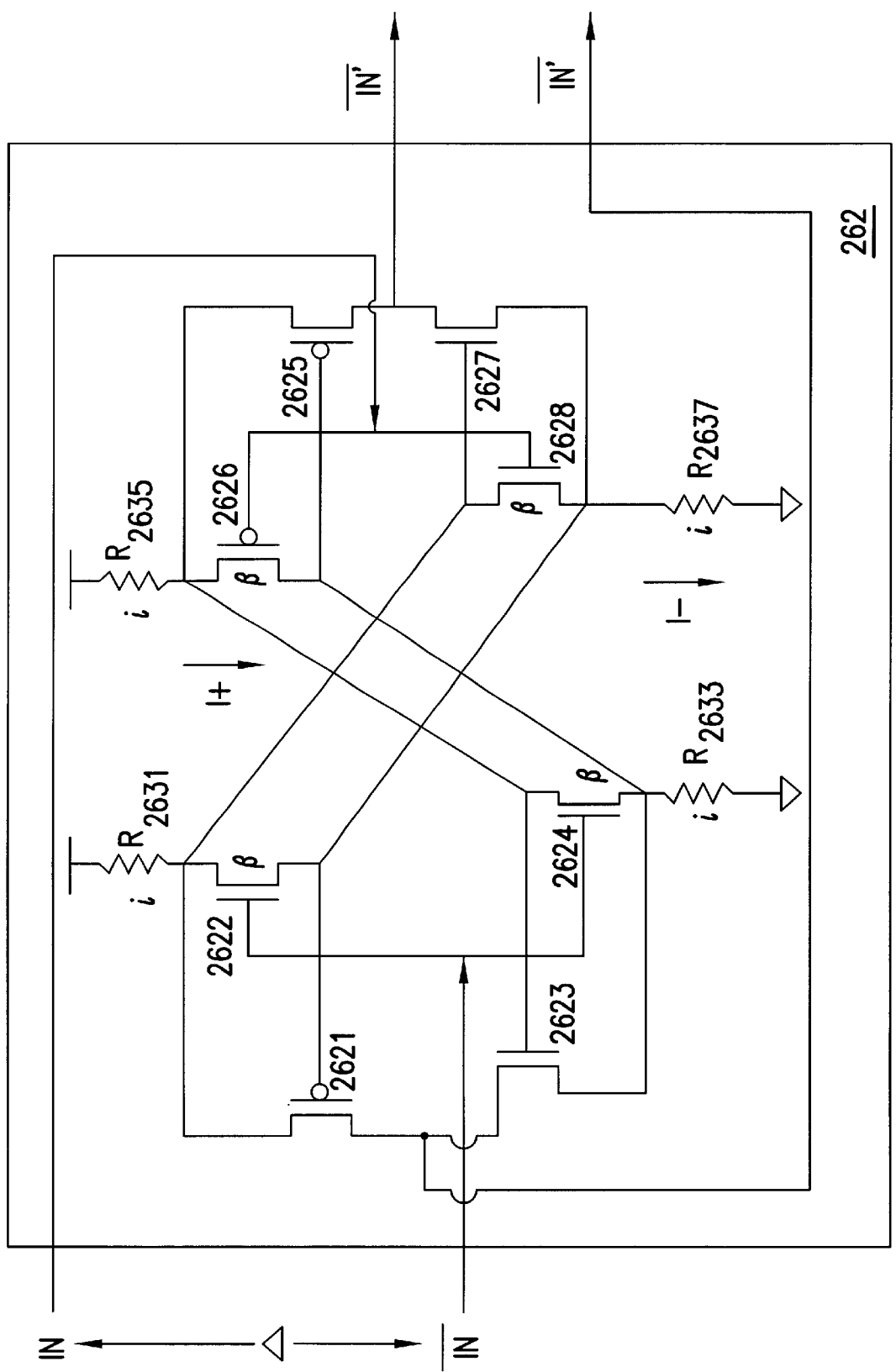
FIG. 4 illustrates an exemplary embodiment of a level shift portion of FIG. 3.

FIGS. 3 and 4 show one exemplary embodiment of the matched current amplifier swing restorer of FIG. 2, where FIG. 3 shows the exemplary matched current amplifier swing restorer and FIG. 4 shows a level shift portion of the matched current amplifier swing restorer. In this exemplary embodiment, the matched current amplifier swing restorer 260 has a wide superior common mode range which outputs a clock with a duty cycle which does not depend on the common mode or swing of the input clocks of the voltage controlled oscillator (VCO) 250. The matched current amplifier swing restorer 260 provides an output swing without abrupt and uncontrolled changes in phase as the frequency varies.

As shown in FIG. 3, the matched current amplifier swing restorer 260 includes a level shift portion 262 which level shifts the input to the matched current amplifier swing restorer 260 to an optimal center voltage while maintaining near constant phase and gain, regardless of the input common mode. As shown in FIG. 3, the matched current amplifier swing restorer 260 also includes a single output portion 264 which amplifies further the input to the matched current amplifier swing restorer 260 while converting the input to a single output voltage. As shown in FIG. 3, the two differential signals (In and In_bar) from the voltage controlled oscillator (VCO) 250 are input to the level shift portion 262 of the wide matched current amplifier swing restorer 260. The level shift portion 262 then level shifts the input while not distorting phase of the input. The level shift portion 262 then outputs the differential signals (In' and In_bar ') to the single output portion 264 of the matched current amplifier swing restorer 260 which amplifies and converts the two differential signals (In and In_bar ) to a single output voltage. The single output portion 264 then outputs the single output voltage from the matched current amplifier swing restorer 260 as the single-ended clock output (Out). Thus a wider voltage swing is restored as a single signal while maintaining the same phase, regardless of the frequency.

As shown in FIG. 4, the level shift portion 262 of the matched current amplifier swing restorer 260 includes input transistors 2621–2628, and load resistors 2631–2637. In one exemplary embodiment of the present invention, as shown in FIG. 4, the β of transistors 2621–2628 are equal to each other. Furthermore, in this exemplary embodiment as shown in FIG. 4, load resistors 2631–2637 comprise load resistances R equal to each other.

By keeping the β of transistors 2621–2628 equal and the load resistance R of load resistors 2631–2637 equal, operation of the matched current amplifier swing restorer 260 as a differential amplifier can be observed. That is, in the level shift portion 262 of the matched current amplifier swing restorer 260, matched current, independent of the bias current, allows all available gains from the transistors 2621–2628 to be converted into differential gain, and allows the differential gain at all possible common modes while keeping the common mode gain at zero for all common modes. Because of constant current in the matched paths, regardless of frequency or common mode, a nearly constant gain and phase are maintained, hence contributing very little phase error to the operation of the synchronizing apparatus 200.

In the exemplary embodiment as shown in FIG. 4, the input differential Δ shown is the difference in voltage between In and In_bar. In the matched current amplifier swing restorer 260, as the input differential Δ goes positive, for any given common mode voltage Vcm, where voltages at inputs In and In_bar are equal or cross-over, the non-inverting current I+ increases and the inverting current I– increases. On the other hand, as the differential Δ goes negative, for any given common mode voltage Vcm, the non-inverting current I+ decreases and the inverting current I– decreases. For β equal to zero at any given common mode voltage Vcm, and the non-inverting current I+ and the inverting current I– are not zero, the non-inverting current I+ the inverting current I– are equal, and thus cancel, resulting in zero common mode gain. The single-ended clock output (Out) of the matched current amplifier swing restorer 260 is determined by amplifying the currents i across the load resistance R and determining the differences in voltage drop across the load resistance R from each current path. Thus, as the non-inverting input (In) varies positive and the other input (In_bar) varies negative from a common mode, the output saturates high, while as the inputs are reversed, the output saturates low.

Accordingly, as shown in FIG. 4, the two differential signals (In and In_bar) from the voltage controlled oscillator (VCO) 250 are input to the level shift portion 262 of the wide matched current amplifier swing restorer 260, where the two differential signals (In and In_bar ) are amplified and level shifted without phase or gain distortion to an optimal control voltage. The level shift portion 262 then outputs the differential signals (In' and In_bar') to the single output portion 264 of the matched current amplifier swing restorer 260 to have the signal further amplified and converted to output a single-ended clock output (Out).

In accordance with the various exemplary embodiments of the present invention, an adjustable duty cycle buffer is included to tune the programmable duty cycle to obtain higher frequency and compensate for any duty cycle distortion in the clock distribution tree. As shown in FIG. 2, the clock distribution tree 275 is provided between the duty cycle buffer 270 and the loop back divider 290. In the embodiment of FIG. 2, the clock distribution tree 275 receives the clock output (CLKOUT) of the synchronizing apparatus (CLKOUT) and delivers this clock output (CLKOUT) to all of the state elements of the microprocessor system on-chip such that all of the state elements see the clock at the same time. However, to deliver the clock output (CLKOUT) to all of the state elements on-chip such that all of the state elements see the clock output (CLKOUT) at the same time, the latency while the clock output (CLKOUT) is in the network may be large, and duty cycle distortion may result. Accordingly, in FIG. 2, by including the duty cycle buffer 270, the programmable duty cycle is tuned to obtain higher frequency to compensate for the duty cycle distortion. Thus, as shown in FIG. 2, the output (OUT) from the matched current amplifier swing restorer 260 is output to duty cycle buffer 270 to obtain the clock output (CLKOUT), before being applied back to the synchronizing circuit 200.

Figure 5:
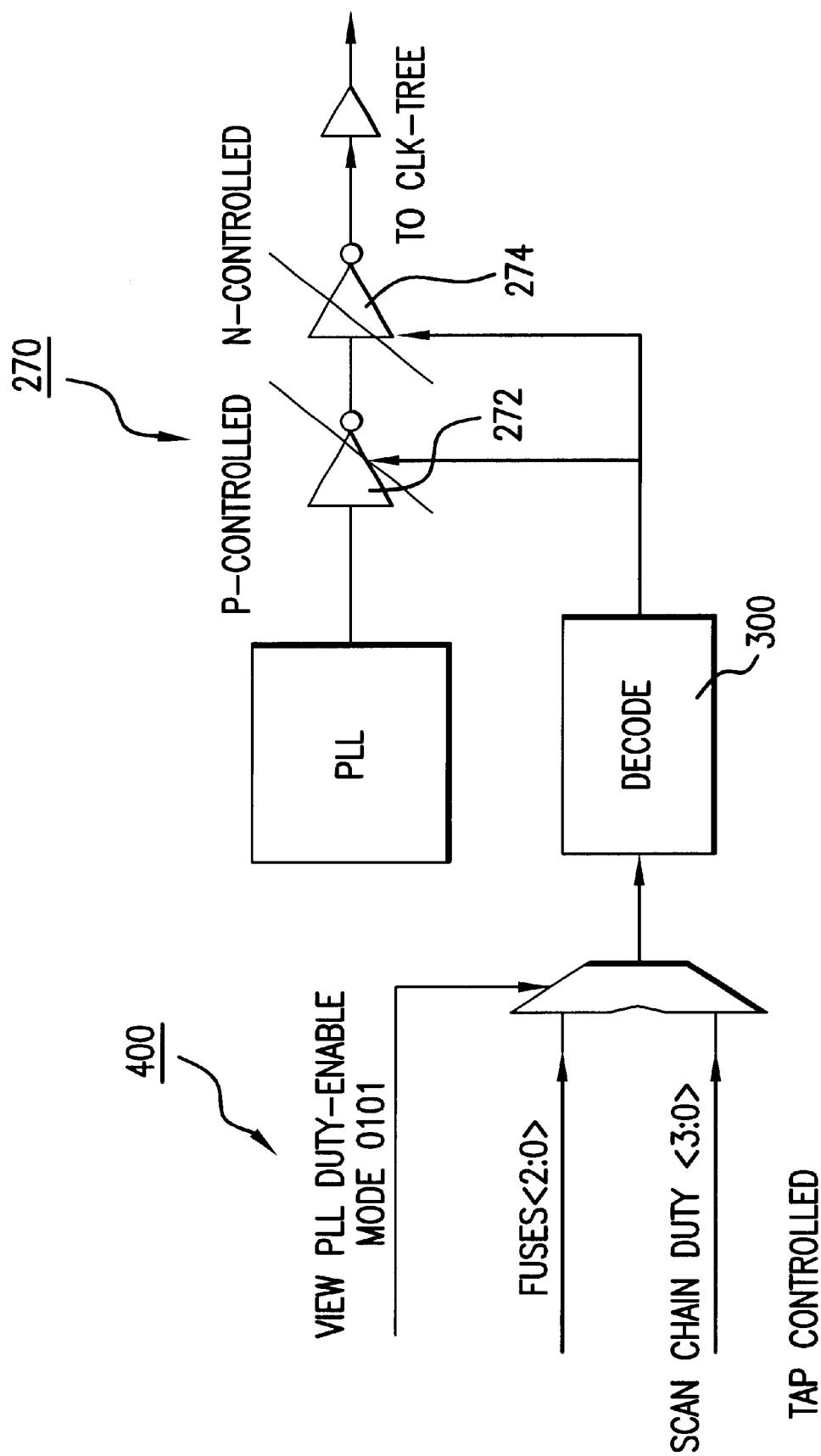
FIG. 5 illustrates an exemplary embodiment of an adjustable duty cycle buffer of the present invention having an override feature added as a test/debug feature.
Figure 6:
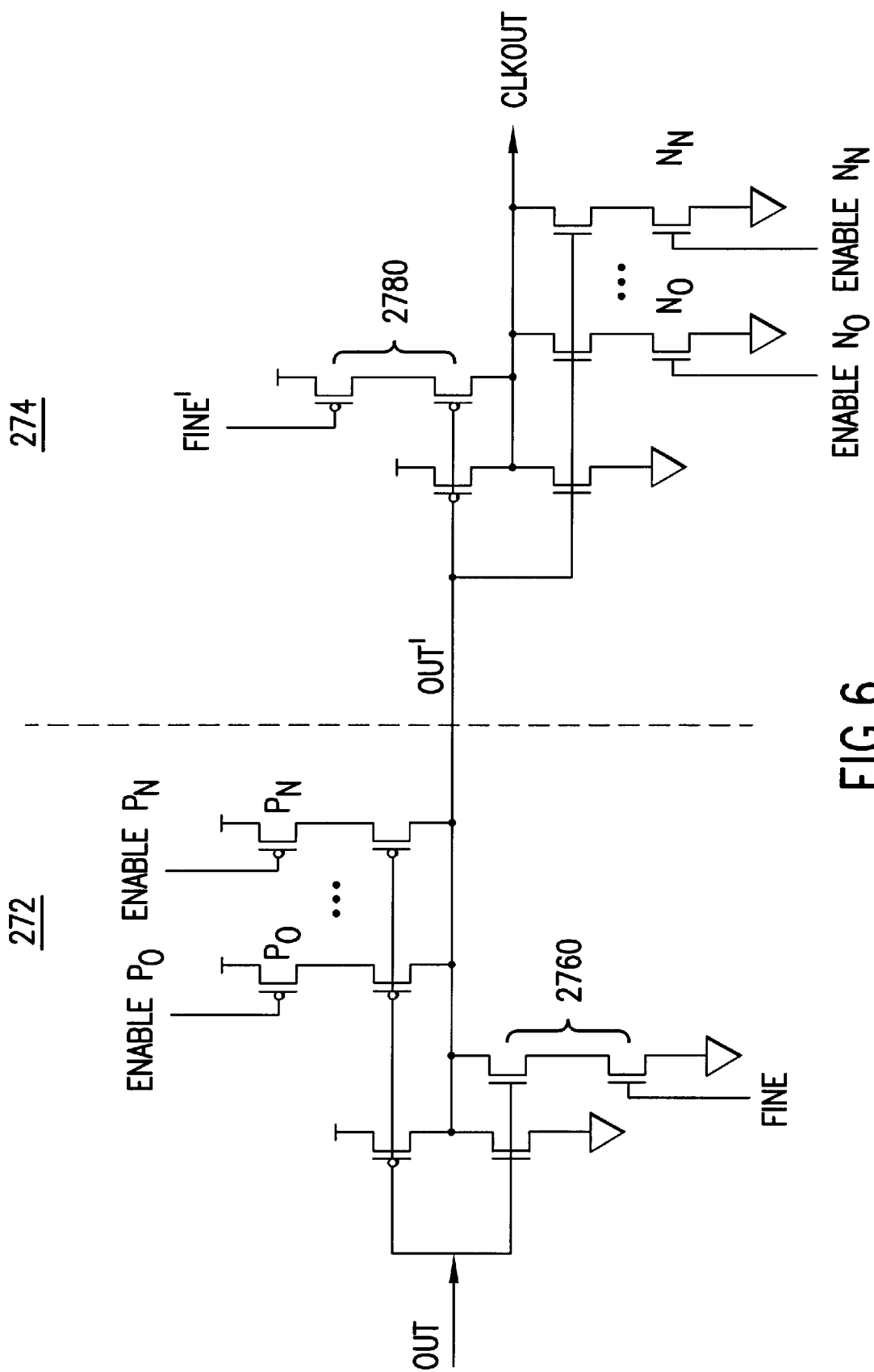
FIG. 6 illustrates an exemplary embodiment of adjustable duty cycle buffer of FIG. 5.

FIGS. 5 and 6 show one exemplary embodiment of the duty cycle control buffer of FIG. 2. In particular, FIG. 5 shows an exemplary embodiment of an adjustable duty cycle buffer having an override feature added as a test/debug feature, and FIG. 6 shows an exemplary embodiment of adjustable duty cycle buffer of FIG. 5.

As shown in FIG. 5, the output of the synthesizing circuit 200 (CLKOUT) is applied to the clock distribution tree 275 before outputting to the loop back divider 290. It should be appreciated that the duty cycle control buffer 270 could be controlled dynamically or statically in the various exemplary embodiments of the present invention.

In the various exemplary embodiments of the present invention, the duty cycle control buffer 270 is programmed to output a duty cycle that achieves the highest frequency, which may not necessarily be a fifty-percent duty cycle. Because the maximum clock frequency may depend on the worst critical phase path, in these exemplary embodiments, the duty cycle control buffer 270 is programmed to output the duty cycle with the highest frequency. Further, in accordance with these exemplary embodiments, the duty cycle is fixed over different operating conditions.

As shown in FIG. 5, the duty cycle control buffer 270 includes a p-controlled portion 272 and an n-controlled portion 274. As shown in FIG. 5, both of the p-controlled portion 272 and n-controlled portion 274 of the duty cycle control buffer 270 are connected to a to a test/debug device 400 via the decoder 300. The test/debug device 400 is connected to a fuse box (not shown) to provide the desired duty cycle to the duty cycle control buffer 270. In the various exemplary embodiments of the present invention, the test/debug device 400 is provided to adjust the duty cycle to expose any marginal functionality, for example.

As shown in FIG. 5, the test/debug device 400 includes 2 modes of operation which include a normal mode and an override mode. In the normal mode, the duty cycle value from the fusse box (not shown) is provided to the duty cycle control buffer 270. In the override mode, the test/debug device 400 overrides the duty cycle value from the fuse box to obtain the desired duty cycle that achieves the best performance as well to expose any marginal phase sensitive path. The value from the test/debug device 400 is then provided to the decoder 300 before being input to the duty cycle control buffer 270.

The p-controlled portion 272 and the n-controlled portion 274 of the duty cycle control buffer 270 is further shown in FIG. 6. As shown in FIG. 6, the p-controlled portion 272 comprises a plurality of p-controlled transistors ($p_0$–$p_n$) and the n-controlled portion 274 comprises a plurality of n-controlled transistors ($n_0$–$n_n$). As shown in FIG. 6, the output (Out) from the matched current amplifier swing restorer 260 is input to the p-controlled portion 272, along with a first output from the decoder 300 (enablep$_0$ –enablep$_n$, Fine). The output (Out') from p-controlled portion 272 is input to the n-controlled portion 274, along with a second output from the decoder 300 (enablen$_0$–enablen$_n$, Fine').

In the exemplary embodiment of FIG. 6, the strength of pull-up of the p-controlled portion is adjusted by adjusting the p-controlled transistors ($p_0$–$p_n$), while the strength of pull-down of the of the n-controlled portion, or the output of the synchronizing system (CLKOUT), is adjusted by adjusting the n-controlled transistors ($n_0$–$n_n$). That is, for pull-up, the number of p-controlled transistors ($p_0$–$p_n$) are asserted such that the pull-up edge of the output of the p-controlled portion (Out') is adjusted. The more p-controlled transistors ($p_0$–$p_n$) are on, the faster the pull-up of the p-controlled portion and the less p-controlled transistors ($p_0$ –$p_n$) are on, the slower the pull-up of the p-controlled portion. Accordingly, by controlling the number of the on p-controlled transistors ($p_0$–$p_n$), the pull-up of the p-controlled portion output (Out') is adjusted.

Similarly, for pull-down, the number of n-controlled transistors ($n_0$–$n_n$) are asserted such that the pull-down edge of the output of the n-controlled portion (CLKOUT) is adjusted. The more n-controlled transistors ($n_0$–$n_n$) are on, the faster the pull-down of the n-controlled portion and the less n-controlled transistors ($n_0$–$n_n$) are on, the slower the pull-down of the n-controlled portion. Accordingly, by controlling the number of the on n-controlled transistors ($n_0$–$n_n$), the pull-down of the n-controlled portion output (CLKOUT) is adjusted. Hence, the duty cycle of the output of the duty cycle buffer 270 (CLKOUT) is programmed, depending on the ON/OFF state of the p-controlled and n-controlled transistors ($p_0$–$p_n$ and $n_0$–$n_n$).

As shown in FIG. 6, the duty cycle control buffer 270 also includes fine mode transistors 2760 and 2780. When transistors 2760 are ON in fine mode, pull-down strength is added. When transistors 2780 are ON in fine mode, the pull-up strength is added. By including the fine mode transistors 2760 and 2780, the effective strengths of 2720 and 2740 transistors become smaller, and hence, the range is reduced.

From the above description and drawings, it will be understood by those of ordinary skill in the art that the particular embodiments shown and described are for purposes of illustration only and are not intended to limit the scope of the invention. Those of ordinary skill in the art will recognize that the invention may be embodied in other specific forms without departing from its spirit or essential characteristics. References to details of particular embodiments are not intended to limit the scope of the claims.

What is claimed is:

1. A synchronizing apparatus, comprising:
   a loop control circuit;
   a voltage controlled oscillator coupled to the loop control circuit;
   a matched current amplifier coupled to the voltage controlled oscillator; and
   a duty cycle control buffer coupled to the matched current amplifier.

2. The synchronizing apparatus of claim 1, the loop control circuit comprising:
   a phase frequency detector;
   a charge pump coupled to the phase frequency detector;
   a loop filter coupled to the charge pump; and
   a bias circuit coupled to the loop filter.

3. The synchronizing apparatus of claim 1, the matched current amplifier being a common mode amplifier.

4. The synchronizing apparatus of claim 3, the matched current amplifier having a wide common mode range.

5. The synchronizing apparatus of claim 4, the voltage controlled oscillator outputting clocks of voltage swings which vary with frequency to the matched current amplifier, and the matched current amplifier outputting a duty cycle independent of the voltage swings of the voltage controlled oscillator.

6. The synchronizing apparatus of claim 1, the matched current amplifier comprising a plurality of transistors, each transistor having a β value equal to one another.

7. The synchronizing apparatus of claim 6, the matched current amplifier comprising a plurality of load resistors, each load resistor having a load resistance value equal to one another.

8. The synchronizing apparatus of claim 1, the duty cycle control buffer outputting a duty cycle set to obtain high frequency.

9. The synchronizing apparatus of claim 8, the duty cycle control buffer comprising a p-controlled portion having a plurality of p-controlled transistors to adjust pull-up strength, and an n-controlled portion having a plurality of n-controlled transistors to adjust pull-down strength.

10. The synchronizing apparatus of claim 9, the duty cycle control buffer further comprising a plurality of first fine mode transistors to add pull-up strength in fine mode, and a plurality of second fine mode transistors to add pull-down strength in the fine mode.

11. A method of synchronizing at least two signals, comprising:
    inputting a system reference signal and a feedback signal;
    generating bias signals corresponding to phase difference between the system reference signal and the feedback signal, the bias signals having a voltage swing;
    providing an output voltage swing corresponding to the bias signals as a single signal, while maintaining a constant phase; and
    outputting a desired programmable duty cycle corresponding to the single signals set to obtain high frequency for feedback.

12. The method of claim 11, providing an output voltage swing comprising a step of a applying a plurality of transistors having an equal β and a plurality of load resistors having equal load resistance.

13. The method of claim 12, further comprising converting gains from the plurality of transistors into differential gains.

14. The method of claim 13, further comprising canceling common mode gain from the plurality of transistors.

15. The method of the claim 11, further comprising providing a duty cycle value from a fuse box as the desired programmable duty cycle.

16. The method of claim 15, further comprising overriding the duty cycle value from the fuse box to obtain the desired duty cycle.

* * * * *